United States Patent
Stapleton et al.

(10) Patent No.: US 9,419,837 B2
(45) Date of Patent: *Aug. 16, 2016

(54) DISTRIBUTED ANTENNA SYSTEM

(71) Applicant: DALI SYSTEMS CO. LTD., George Town, Grand Cayman (KY)

(72) Inventors: Shawn Patrick Stapleton, Burnaby (CA); Paul Lemson, Woodinville, WA (US); Bin Lin, Burnaby (CA); Albert S. Lee, San Mateo, CA (US)

(73) Assignee: Dali Systems Co. Ltd., George Town, Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 14/800,515

(22) Filed: Jul. 15, 2015

(65) Prior Publication Data

US 2016/0014782 A1    Jan. 14, 2016

Related U.S. Application Data

(63) Continuation of application No. 14/260,145, filed on Apr. 23, 2014, now Pat. No. 9,137,078, which is a continuation of application No. 13/211,247, filed on Aug. 16, 2011, now Pat. No. 8,737,300.

(60) Provisional application No. 61/439,940, filed on Feb. 7, 2011.

(51) Int. Cl.
*H04L 27/26* (2006.01)
*H03F 1/32* (2006.01)
(Continued)

(52) U.S. Cl.
CPC .......... *H04L 27/2618* (2013.01); *H03F 1/3247* (2013.01); *H03F 3/24* (2013.01);
(Continued)

(58) Field of Classification Search
CPC ........................... H04L 27/2618; H03F 1/3247
See application file for complete search history.

(56) References Cited

U.S. PATENT DOCUMENTS 5,880,863 A    3/1999   Rideout et al.
6,393,007 B1   5/2002   Haartsen
(Continued)

FOREIGN PATENT DOCUMENTS

CN    101453699 A    6/2009
CN    101453799 A    6/2009
(Continued)

OTHER PUBLICATIONS

International Search Report and Written Opinion Of The International Searching Authority for International Application No. PCT/US2011/048004 mailed on Jan. 5, 2012, 6 pages.
(Continued)

*Primary Examiner* — Wei Zhao
(74) *Attorney, Agent, or Firm* — Kilpatrick Townsend & Stockton LLP

(57) ABSTRACT

The present disclosure is a novel utility of a software defined radio (SDR) based Distributed Antenna System (DAS) that is field reconfigurable and support multi-modulation schemes (modulation-independent), multi-carriers, multi-frequency bands and multi-channels. The present invention enables a high degree of flexibility to manage, control, enhance, facilitate the usage and performance of a distributed wireless network such as Flexible Simulcast, automatic traffic load-balancing, network and radio resource optimization, network calibration, autonomous/assisted commissioning, carrier pooling, automatic frequency selection, frequency carrier placement, traffic monitoring, traffic tagging, pilot beacon, etc. As a result, a DAS in accordance with the present invention can increase the efficiency and traffic capacity of the operators' wireless network.

16 Claims, 8 Drawing Sheets

(51) Int. Cl.

| | | |
|---|---|---|
| H03F 3/24 | (2006.01) | |
| H04L 25/03 | (2006.01) | |
| H04L 27/36 | (2006.01) | |
| H04W 24/02 | (2009.01) | |
| H04B 1/04 | (2006.01) | |
| H04W 24/04 | (2009.01) | |
| H04W 40/00 | (2009.01) | |
| H04W 72/04 | (2009.01) | |

(52) U.S. Cl.
CPC ....... *H04B 1/0475* (2013.01); *H04L 25/03343* (2013.01); *H04L 27/362* (2013.01); *H04W 24/02* (2013.01); *H04W 24/04* (2013.01); *H04W 40/00* (2013.01); *H04W 72/0453* (2013.01); *H03F 2200/336* (2013.01); *H03F 2200/57* (2013.01); *H03F 2201/3224* (2013.01); *H03F 2201/3233* (2013.01); *H04L 2025/03414* (2013.01)

(56) References Cited

U.S. PATENT DOCUMENTS

| | | | |
|---|---|---|---|
| 6,493,335 | B1 | 12/2002 | Darcie et al. |
| 6,625,429 | B1 | 9/2003 | Yamashita |
| 6,657,993 | B1 * | 12/2003 | Casanova ............ H04L 12/6418 370/230 |
| 6,724,737 | B1 | 4/2004 | Boyden et al. |
| 6,801,767 | B1 * | 10/2004 | Schwartz ......... H04B 10/25755 398/115 |
| 7,102,442 | B2 | 9/2006 | Anderson |
| 7,145,704 | B1 | 12/2006 | Islam |
| 7,283,519 | B2 | 10/2007 | Girard |
| 7,362,776 | B2 | 4/2008 | Meier et al. |
| 7,489,632 | B2 | 2/2009 | Lakkakorpi |
| 7,496,367 | B1 | 2/2009 | Ozturk et al. |
| 7,634,536 | B2 | 12/2009 | Halasz |
| 7,765,294 | B2 | 7/2010 | Edwards et al. |
| 7,801,038 | B2 | 9/2010 | Liao et al. |
| 7,826,369 | B2 | 11/2010 | Filsfils et al. |
| 7,855,977 | B2 | 12/2010 | Morrison et al. |
| 8,036,226 | B1 | 10/2011 | Ma et al. |
| 8,098,572 | B2 | 1/2012 | Zhou et al. |
| 8,139,492 | B1 | 3/2012 | Peterson et al. |
| 8,363,628 | B2 | 1/2013 | Chi et al. |
| 8,451,735 | B2 | 5/2013 | Li |
| 8,478,331 | B1 | 7/2013 | Rogers |
| 8,520,603 | B2 | 8/2013 | Kozisek et al. |
| 8,527,003 | B2 | 9/2013 | Gupta et al. |
| 8,682,338 | B2 | 3/2014 | Lemson et al. |
| 8,737,300 | B2 | 5/2014 | Stapleton et al. |
| 2001/0034223 | A1 | 10/2001 | Rieser et al. |
| 2002/0075906 | A1 * | 6/2002 | Cole ................ H04B 10/25756 370/535 |
| 2002/0086675 | A1 | 7/2002 | Mansour |
| 2002/0093926 | A1 | 7/2002 | Kilfoyle |
| 2003/0021263 | A1 | 1/2003 | Lee |
| 2003/0181221 | A1 | 9/2003 | Nguyen |
| 2004/0053624 | A1 | 3/2004 | Frank et al. |
| 2005/0152695 | A1 | 7/2005 | Sulzberger et al. |
| 2005/0181812 | A1 | 8/2005 | Scheck |
| 2005/0206564 | A1 | 9/2005 | Mao et al. |
| 2005/0220066 | A1 | 10/2005 | Wal et al. |
| 2006/0270366 | A1 | 11/2006 | Rozenblit et al. |
| 2007/0019598 | A1 | 1/2007 | Prehofer |
| 2007/0058742 | A1 | 3/2007 | Demarco et al. |
| 2007/0065078 | A1 | 3/2007 | Jiang |
| 2007/0147488 | A1 | 6/2007 | Han |
| 2007/0177552 | A1 | 8/2007 | Wu et al. |
| 2008/0051129 | A1 | 2/2008 | Abe et al. |
| 2008/0146146 | A1 | 6/2008 | Binder et al. |
| 2008/0225816 | A1 | 9/2008 | Osterling et al. |
| 2008/0240036 | A1 | 10/2008 | Liu et al. |
| 2009/0274048 | A1 | 11/2009 | Sambhwani et al. |
| 2010/0087227 | A1 | 4/2010 | Francos et al. |
| 2010/0136998 | A1 | 6/2010 | Lott et al. |
| 2010/0202565 | A1 | 8/2010 | Abbasfar |
| 2010/0279704 | A1 | 11/2010 | Vachhani |
| 2010/0299173 | A1 | 11/2010 | Zampiello et al. |
| 2010/0311372 | A1 | 12/2010 | Bouyaud et al. |
| 2011/0103309 | A1 | 5/2011 | Wang et al. |
| 2012/0039254 | A1 | 2/2012 | Stapleton et al. |
| 2013/0272202 | A1 | 10/2013 | Stapleton et al. |
| 2014/0286247 | A1 | 9/2014 | Lemson et al. |
| 2014/0313884 | A1 | 10/2014 | Stapleton et al. |
| 2016/0080082 | A1 | 3/2016 | Lemson et al. |

FOREIGN PATENT DOCUMENTS

| | | |
|---|---|---|
| CN | 101521893 A | 9/2009 |
| CN | 103201958 A | 7/2013 |
| EP | 2606576 | 6/2013 |
| JP | 2004-147009 A2 | 5/2004 |
| JP | 2007-523577 A | 8/2007 |
| JP | 2007/235738 A | 9/2007 |
| JP | 2007-529926 A | 10/2007 |
| JP | 2008-099137 A2 | 4/2008 |
| JP | 2008-516503 A | 5/2008 |
| JP | 2009-296335 A2 | 12/2009 |
| JP | 2010-166531 A2 | 7/2010 |
| KR | 2009-0088083 A | 8/2009 |
| WO | 00/23956 A1 | 4/2000 |
| WO | 02/23956 A2 | 3/2002 |
| WO | 02/47414 A2 | 6/2002 |
| WO | 2008/146394 A1 | 12/2008 |
| WO | 2008/154077 A1 | 12/2008 |
| WO | 2012/024343 A1 | 2/2012 |
| WO | 2012/024349 A1 | 2/2012 |

OTHER PUBLICATIONS

International Search Report and Written Opinion Of The International Searching Authority for International Application No. PCT/US2011/047995 mailed on Dec. 22, 2011, 7 pages.
International Search Report and Written Opinion of the International Searching Authority for International Application No. PCT/US2011/047999 mailed on Dec. 19, 2011, 7 pages.
Non-Final Office Action for U.S. Appl. No. 13/211,247 mailed on Oct. 10, 2012, 6 pages.
Notice of Allowance for U.S. Appl. No. 13/211,247 mailed on Mar. 13, 2013, 11 pages.
Non-Final Office Action for U.S. Appl. No. 13/211,247 mailed on Jul. 22, 2013, 11 pages.
Final Office Action for U.S. Appl. No. 13/211,247 mailed on Nov. 26, 2013, 13 pages.
Notice of Allowance for U.S. Appl. No. 13/211,247 mailed on Mar. 11, 2014, 10 pages.
Non-Final Office Action for U.S. Appl. No. 13/913,207 mailed on Nov. 20, 2014, 22 pages.
Non-Final Office Action for U.S. Appl. No. 14/260,145 mailed on Jan. 27, 2015, 10 pages.
Non-Final Office Action of May 30, 2013 for U.S. Appl. No. 13/211,243, 10 pages.
Notice of Allowance of Nov. 8, 2013 for U.S. Appl. No. 13/211,243, 11 pages.
Final Office Action for U.S. Appl. No. 13/913,207 mailed on Apr. 15, 2015, 15 pages.
Notice of Allowance of May 8, 2015 for U.S. Appl. No. 14/260,145 13 pages.
Notice of Allowance of May 26, 2015 for U.S. Appl. No. 13/913,207, 11 pages.
Second Office Action for Chinese Patent Application No. 20118005066.6 mailed on Apr. 13, 2015, 7 pages.
First Office Action for Chinese Patent Application No. 20118005066.6 mailed on Aug. 4, 2014, 7 pages.
U.S. Appl. No. 14/949,405, filed Nov. 23, 2015 by Lemson et al.

* cited by examiner

DISTRIBUTED ANTENNA SYSTEM

CROSS-REFERENCES TO RELATED APPLICATIONS

The present application is a continuation of U.S. patent application Ser. No. 14/260,145, filed Apr. 23, 2014, which is a continuation of U.S. patent application Ser. No. 13/211,247, filed Aug. 16, 2011, which claims the benefit of U.S. Provisional Patent Application No. 61/439,940, filed Feb. 7, 2011, the disclosures of which are hereby incorporated by reference for all purposes.

FIELD OF THE INVENTION

The present invention generally relates to wireless communication systems employing Distributed Antenna Systems (DAS) as part of a distributed wireless network. More specifically, the present invention relates to a DAS utilizing one or more remotely monitored and controlled digital access units configured to assign particular packet transmissions to selected ones of a plurality of remote units, which can in some embodiments be configured in a daisy-chained rings.

BACKGROUND OF THE INVENTION

Wireless and mobile network operators face the continuing challenge of building networks that effectively manage high data-traffic growth rates. Mobility and an increased level of multimedia content for end users requires end-to-end network adaptations that support both new services and the increased demand for broadband and flat-rate Internet access. One of the most difficult challenges faced by network operators is maximizing the capacity of their DAS networks while ensuring cost-effective DAS deployments and at the same time providing a very high degree of DAS remote unit availability.

In order to provide DAS network capacity which is high enough to meet short-term needs of network subscribers in specific locations yet also avoid costly and inefficient deployment of radio resources, DAS network planners prefer to employ DAS architectures and solutions which provide a high degree of dynamic flexibility. Therefore, it would be advantageous for wireless network operators to employ a DAS solution which has a high degree of flexibility to implement dynamic rearrangements based on ever-changing network conditions and subscriber needs. Also, the more future-proof a DAS deployment can be, generally the lower its life cycle cost.

DAS network planners and system integrators employ a wide range of innovative approaches for helping to ensure that a particular DAS deployment is as cost-effective as possible. The types of costs considered by network planners and integrators include DAS deployment or DAS installation cost, as well as operational costs including maintenance costs, emergency restoration costs and network re-arrangement costs. Rearrangement costs are particularly significant for indoor DAS applications, due to frequent changes in building use and facility needs changes. Therefore, it would be advantageous to employ DAS systems and methods which are based on as few DAS transport facilities as possible to minimize installation and/or lease costs and have self-healing capabilities to avoid the need for costly emergency restoration services.

In order to obtain a high degree of DAS remote unit availability, two primary conditions must be satisfied. First, the DAS remote unit itself must be inherently reliable. Second, the transport media e.g., optical fiber, must be very reliable. It is well known that electronic and/or optical connections themselves are a significant root cause of failure or reduced availability in a DAS network. Companies who maintain outdoor DAS networks have reported that a failure of outside plant optical fiber facilities is not as rare as would be desirable. Therefore, it would be advantageous to employ systems and methods which offer higher redundancy and/or self-healing features in the event of failure of a transport media connection.

SUMMARY OF THE INVENTION

The present invention substantially achieves the advantages and benefits discussed above and overcomes the limitations of the prior art discussed above by providing a distributed antenna system responsive to one or more base stations and having at least one but in some embodiments a plurality of Digital Access Units ("DAU's"), each operating to control the packet traffic of an associated plurality of Digital Remote Units ("DRU's"). In embodiments employing multiple DAU's, the DAU's can be daisy-chained linearly or in a ring configuration. Likewise, depending upon the implementation, the DRU's associated with a given DAU can be configured in either a linear or ring Daisy chain configuration.

The data received from the base stations is down-converted, digitized and converted to baseband with the DAU. The data streams are then I/Q mapped and framed and independently serialized, such that multiple data streams are available in parallel from the DAU. In at least some embodiments, the DAU communicates with the associated DRU's via an optical transport arrangement. It will be appreciated by those skilled in the art that, using the present invention, it is possible to configure a distributed antenna system having n base stations, each providing m RF outputs for transmission by one or more associated DAU's to o DRU's, where the only limits are imposed by the technical performance specifications of the particular DAS, such as delay.

By the use of a ring configuration for connecting, in at least some embodiments, the DRU's and/or the DAU's, fault tolerance is built into the system, with resulting high availability. In single DAU embodiments, each DRU is accessible through two paths, and therefore remains available even in the event of a line break. In multi-DAU embodiments, where the DAU's are linearly daisy-chained, each DRU is accessible from multiple DRU's such that even some DAU failures will not prevent system operation. In embodiments employing a ring connection for the DAU's, multiple paths exist to each DAU, and thus provide an additional level of fault tolerance as well as dynamic load balancing and resource management as discussed in greater detail hereinafter.

Thus, the configuration of the advanced system architecture of the present invention provides a high degree of flexibility to manage, control, enhance and facilitate the radio resource efficiency, usage, availability, and overall performance of the distributed wireless network. The present invention enables specialized applications and enhancements including Flexible Simulcast, automatic traffic load-balancing, network and radio resource optimization, network calibration, autonomous/assisted commissioning, carrier pooling, automatic frequency selection, radio frequency carrier placement, traffic monitoring, traffic tagging, and indoor location determination using pilot beacons. The present invention can also serve multiple operators, multi-mode radios (modulation-independent) and multi-frequency bands per operator to increase the efficiency and traffic capacity of the operators' wireless networks.

Further the present invention provides a high degree of dynamic flexibility, supports dynamic re-arrangements, and provides a low life cycle cost. This advanced system architecture enables deployment of DAS networks using fewer DAS transport facilities to reduce costs, while providing self-healing features. The present invention also offers redundancy and enhanced system availability.

It is an object of the present invention to provide Flexible Simulcast capabilities, as disclosed in U.S. Provisional Application Ser. No. 61/382,836, entitled "Remotely Reconfigurable Distributed Antenna System and Methods," filed Sep. 14, 2010, incorporated herein by reference, in a high-availability ring configuration using, for example, optical fiber transport. As discussed above, the ring configuration insures that a break in any optical fiber cable will not shut down the daisy-chained network, because the downlink and uplink signals can be rerouted around the cable break to the respective DRUs.

It is a further object of the present invention to balance the bidirectional data rate on the optical fibers so as to increase the maximum achievable data rate during operation on the ring network of DRUs.

It is a further object of the present invention to provide higher transport network capacity in the event the data transport is asymmetrical between the downlink and uplink, as is typically the case for mobile broadband networks.

It is a further object of the present invention to provide an adaptive and automatic control for optimizing the transport media capacity on the ring.

It is a further object of the present invention to provide a method of summing co-channel users' uplink signals in the DRU daisy chain.

Applications of the present invention are suitable to be employed with distributed base stations, distributed antenna systems, distributed repeaters, mobile equipment and wireless terminals, portable wireless devices, and other wireless communication systems such as microwave and satellite communications. The present invention is also field upgradable through a link such as an Ethernet connection to a remote computing center.

Appendix I is a glossary of terms used herein, including acronyms.

BRIEF DESCRIPTION OF THE DRAWINGS

Further objects and advantages of the present invention can be more fully understood from the following detailed description taken in conjunction with the accompanying drawings in which:

FIG. 4 provides an example of a daisy chain ring network.

DETAILED DESCRIPTION OF THE INVENTION

Figure 1:
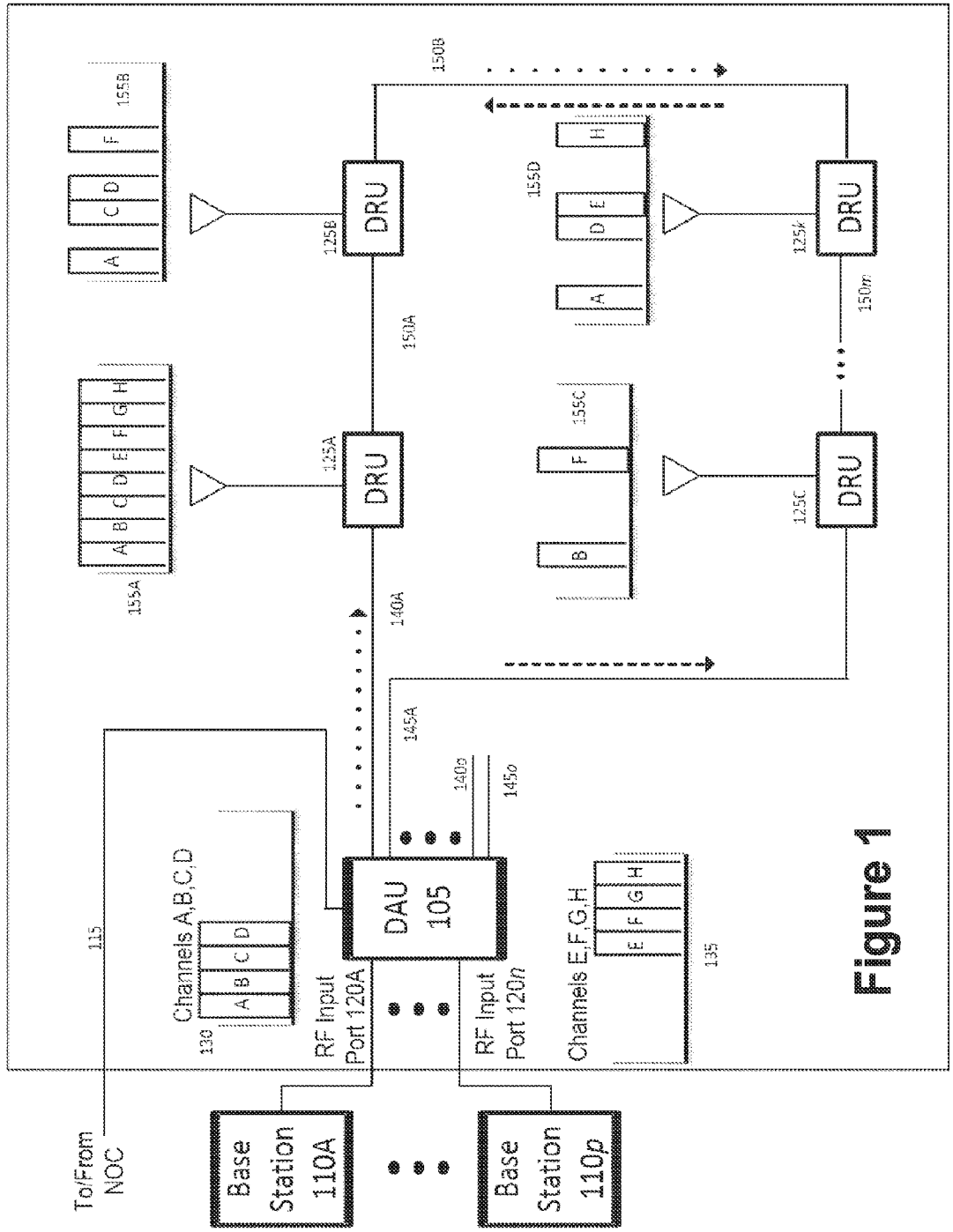
FIG. 1 is a block diagram according to one embodiment of the invention showing the basic structure and an example of a unidirectional, channelized downlink transport, one ring scenario based on having one DAU and four DRUs.

The present invention is a novel Reconfigurable Distributed Antenna System that provides a high degree of flexibility to manage, control, re-configure, enhance and facilitate the radio resource efficiency, usage and overall performance of the distributed wireless network. FIG. 1 illustrates an embodiment of the Distributed Antenna System 100 that provides an example of a unidirectional, channelized downlink transport in accordance with the present invention. In FIGS. 1-4, a dotted line denotes a distinct subset of uplink and downlink channels identified as "A." A dashed line denotes a distinct subset of uplink and downlink channels identified as "B." The subset of uplink and downlink channels in A do not include those of B and vice versa. The system employs a Digital Access Unit functionality 105 (hereinafter "DAU"). The DAU 105 serves as an interface between associated base stations (BTS) 110A-B and a plurality of digital remote units (DRU) 125A-$n$, although only four DRU's are shown in FIG. 1. In the present description, "DRU" will be used interchangeably with Remote Radio Head Unit, or "RRU", because of the similarity of the functions discussed herein, although those skilled in the art will recognize that a DRU communicates with a DAU, whereas an RRU communicates with a base station. In addition, those skilled in the art will recognize that a DAU is monitored and controlled by a remote network operations center ("NOC"), as indicated at bidirectional link 115 in FIG. 1. Such links are typically Ethernet connections or external modems, but can be any form of link suitable for remote monitoring and control. The NOC has the capability to remotely configure the DAU parameter settings which in turn configures the DRU's parameter settings. The NOC can request information from the DAUs. The DAUs can subsequently request information from the DRUs. The information requested includes but is not limited to uplink power, downlink power, optical error rate, gain settings, active carriers, etc.

For the downlink (DL) path, RF input signals 120A through 120$n$ are received at the DAU 105 from one or more base station units (BTS) indicated at 110A through 11 Op. The RF input signals are separately down-converted, digitized, and converted to baseband (using a Digital Down-Converter) by the DAU. Data streams are then I/Q mapped and framed and specific parallel data streams are then independently serialized and translated to optical signals using pluggable SFP modules, again by the DAU 105. The independently serialized, parallel data streams are then delivered to different DRU's 125A-125$k$, typically over optical fiber cable arranged, in at least some embodiments, in a ring configuration indicated at connection pairs 140A-145A, or, in other embodiments, a daisy chain configuration. In addition, each DAU can support a plurality of rings with associated DRU's, where the additional rings are indicated by fiber optic pairs up through 140o-145o. It will be appreciated by those skilled in the art that the number of RF inputs, DAU's and DRU's and rings is limited only by network performance factors, such as delay. In addition, as discussed in connection with FIG. 4 herein, the DAS can be further extended by using a ring or daisy-chain of DAU's, each of which supports an arrangement of DRU's and rings as shown in FIG. 1.

One function of the DAU 105 is to determine the direction in which downlinked channels are propagated around the ring. As just one example, the embodiment shown in FIG. 1 is configured to have downlink channels A, B, C and D propagate in a first direction, for example clockwise, and channels E, F, G, and H propagate in the counter direction, although it will be understood that the number of channels propagating in each direction need not be equal, nor adjacent, nor sequential. Likewise, the number of channels received at each DRU is assigned by the DAU and need not be equal, adjacent or sequential, but instead will typically be any configuration that optimizes network utilization.

Figure 2:
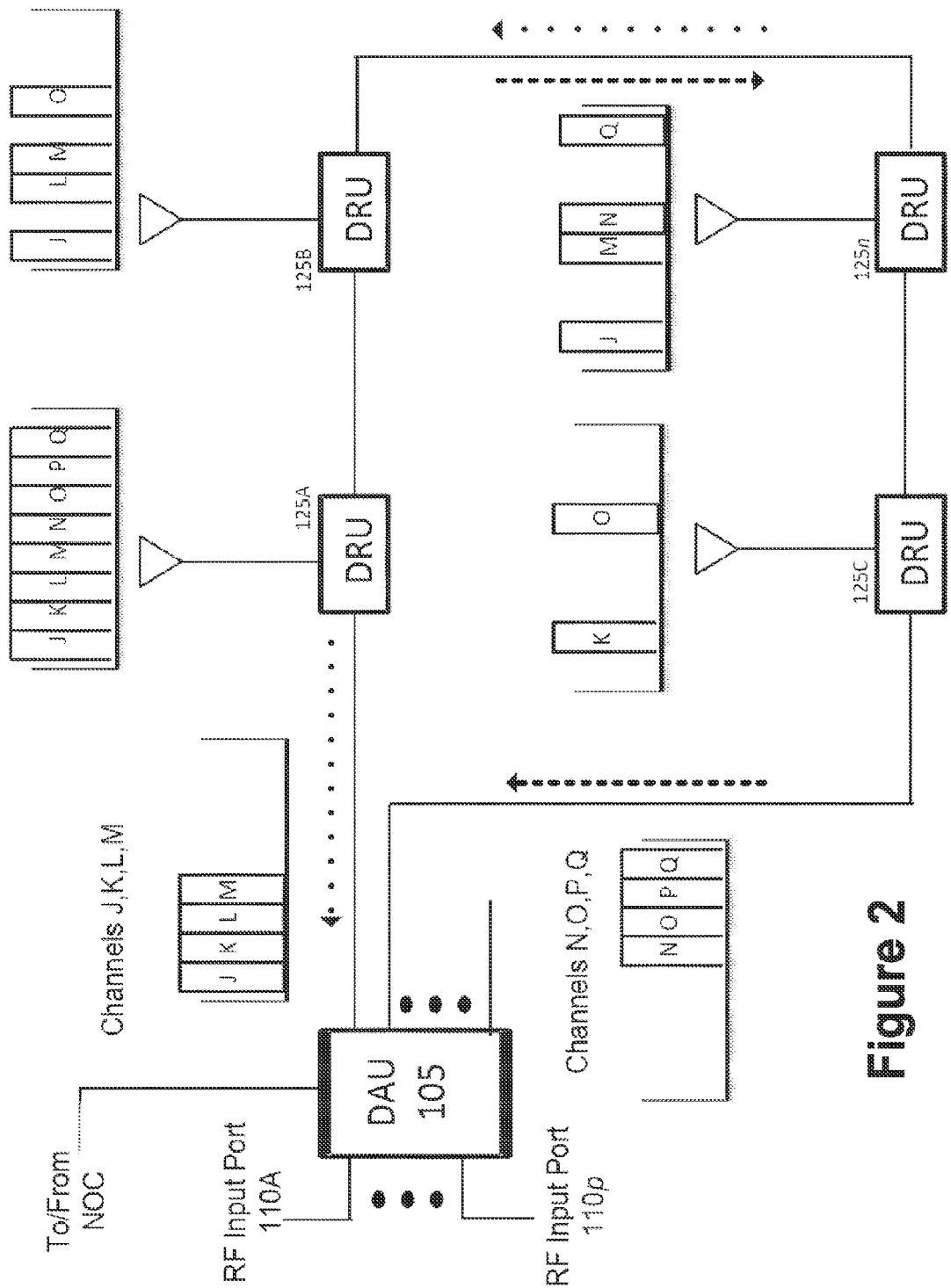
FIG. 2 is a block diagram in accordance with an embodiment of the invention showing the basic structure and an example of a unidirectional, channelized uplink transport, one ring scenario based on having one DAU and four DRUs.

Referring next to FIG. 2, an embodiment of an uplink (UL) path in accordance with the invention can be better appreciated. Channels received at the antenna associated with each DRU are converted into optical signals by each DRU 125A-125k. Optical signals received from the DRU's are de-serialized and de-framed by the DAU 105, and are also up-converted digitally using a Digital Up-Converter implemented within the DAU 105. Each data stream is then independently converted to the analog domain and up-converted to the appropriate RF frequency band, still within the DAU 105 in the illustrated implementation, although this functionality can be separate. The RF signals are then delivered to the appropriate one of a plurality of BTS' 110A-110p. As with the arrangement shown in FIG. 1, the direction of propagation of each channel is controlled by the DAU, with some channels propagating in a clockwise direction and others in a counter-clockwise direction. Also as discussed in connection with FIG. 1, while adjacent channels are shown as propagating in the same direction in FIG. 2, this is not required and any channel can be selected to propagate in either direction.

Referring again to FIG. 1, it will be appreciated by those skilled in the art that, in some implementations of a DAS, more than one carrier can exist in each channel, and, as such, a DRU may receive a channel comprising a signal containing two or more carriers, or a wireless operator may have more than one RF carrier per channel allocated to a single base station. This is referred to as a "composite signal". The manner in which a composite downlink signal is managed by the present invention can be better understood with reference to FIG. 1. In such instances, the DAU will receive a composite downlink input signal 130 from, e.g., a first base station 110A belonging to one wireless operator, enters the DAU 105 at the RF input port 120A. Composite signal 130 comprises carriers A-D. A second composite downlink input signal from e.g., a pth base station 110p belonging to the same wireless operator enters DAM at the DAU1 RF input port 120n. Composite signal 135 comprises carriers E-H. The functionality of the DAU 105, and DRU's 125A-125k, respectively, are explained in detail in U.S. Provisional Application Ser. No. 61/374,593, entitled "Neutral Host Architecture for a Distributed Antenna System," filed Aug. 17, 2010, the disclosure of which is hereby incorporated by reference in its entirety for all purposes.

One optical output of DAU 105 is fed to DRU 125A, via bidirectional optical cable 140A. A second optical output of DAU 105 is fed via bidirectional optical cable 145A to DRU3. Similarly, bidirectional optical cables 150, 155 and 160 connect DRU's 125A-n in a ring configuration, such that DRU 125A connects to DRU 125B via cable 150A, DRU 125B connects to DRU 125n via cable 15013, and DRU 125k connects to DRU 125C, or the kth-1 DRU, via cable 150m. This connection facilitates networking of DAU 105, which means that all of Carriers A-H are available within DAU 105 to transport data to DRU's 125A-k depending on software settings within the networked DAU system. Depending upon the embodiment, the software settings within DRU 125A are configured either manually or automatically, such that carriers A-H are present in the downlink output signal 155A at the antenna port of DRU 125A. The presence of all eight carriers means that DRU 125A is potentially able to access the full capacity of both base stations feeding DAU 105. A possible application for DRU 125A is a cafeteria in an enterprise building during the lunch hour where a large number of wireless subscribers are gathered.

DRU 125B is fed by a second optical port of DRU 125A via bidirectional optical cable 150A. The optical cable 150A performs the function of daisy chaining DRU 125A with DRU 12513. As with DRU 125A, the software settings within DRU 125B are configured either manually or automatically such that Carriers A, C, D and F are present in downlink output signal 155E at the antenna port of DRU 1258. The capacity of DRU 125B is set to a much lower value than DRU 125A by virtue of its specific channel settings as controlled by DAU 105. The individual Digital Remote Units have integrated frequency selective DUCs and DDCs with gain control for each carrier. The DAU's can remotely turn on and off the individual carriers via the gain control parameters.

In a similar manner as described previously for DRU 125A, the software settings within DRU 125C are configured either manually or automatically such that Carriers B and F are present in downlink output signal 155C at the antenna port of DRU 125C. Compared to the downlink signal 155B at the antenna port of DRU 12513, the capacity of DRU 125C, which is also configured via its software settings, is much less than the capacity of DRU 125B. DRU 125n is fed by the optical cable 150m connected to the second optical port of the $n^{th}$-1 DRU, shown for simplicity in FIG. 1 as DRU 125C. The software settings within DRU 125n are configured either manually or automatically such that carriers A, D, E and H are present in downlink output signal 155D at the antenna port of DRU 125n. Typically, the capacity of DRU 125n is set to a much lower value than DRU 125A, however, the relative capacity settings of each of DRU's 125A-n can be adjusted dynamically to meet the capacity needs within the coverage zones determined by the physical positions of antennas connected to those DRU's. As noted above, the ring connection is completed by interconnecting DRU 125B and DRU 125n through optical cable 150B. The ring configuration insures that any optical cable breaks will not shut down the daisy chained network. The downlink and uplink signals will be rerouted around the cable break to the respective DRUs.

The present invention facilitates conversion and transport of several discrete relatively narrow RF bandwidths. This approach allows conversion of only those multiple specific relatively narrow bandwidths which carry useful or specific information. This approach also allows more efficient use of the available optical fiber transport bandwidth for neutral host applications, and allows transport of more individual operators' band segments over the optical fiber. As disclosed in U.S. Provisional Application Ser. No. 61/374,593, entitled "Neutral Host Architecture for a Distributed Antenna System," filed Aug. 17, 2010 together with U.S. Provisional Application Ser. No. 61/382,836, entitled "Remotely Reconfigurable Distributed Antenna System and Methods", filed Sep. 14, 2010, both assigned to the assignee of the present invention, and also referring to FIG. 1 of the instant patent application, Digital Up Converters located within the DRU can be dynamically reconfigured as the result of commands from the NOC to transport from the DAU input to any specific DRU output any specific narrow frequency band or bands, RF carriers or RF channels which are available at the respective RF input port of either DAU. This capability is illustrated in FIG. 1 where only specific frequency bands or RF carriers appear at the output of a given DRU. More specifically, through commands received from the NOC, the FPGA's in the DAU and one or more of the associated DRU's can be reprogrammed or reconfigured to convert and transport only the desired narrow bandwidths.

A related capability of the present invention is that not only can the Digital Up Converters located within each DRU be configured to transport any specific narrow frequency band from the DAU input to any specific DRU output, but also the Digital Up Converters within each DRU can be configured to transport any specific time slot or time slots of each carrier from the DAU input to any specific DRU output. The carriers and time slots are monitored by the DAU by filtering the signals and performing power detection of the individual time slots, which information can be conveyed to the NOC as desired. Then, as with the Digital Up Converters, the Field Programmable Gate Arrays (FPGA) in the DAU or DRU can be dynamically reconfigured by commands received from the NOC in a manner analogous to software programmability. The DAU detects which carriers and corresponding time slots are active. This information is relayed to the individual DRUs via the management control and monitoring protocol software. This information is then used, as appropriate, by the DRUs for turning off and on individual carriers and their corresponding time slots.

Data transport between the Base Station and the subscribers is typically asymmetrical, whereby the downlink data rate is higher than the uplink rate. The ring network configuration of Daisy Chained DRUs can exploit this data rate asymmetry to maximize the data transport on the optical fibers 150A-150m.

The present invention balances the bidirectional data rate on the optical fibers so as to increase the maximum achievable data rate on the ring network of DRUs. The individual downlink channels are transmitted in a unidirectional sense along the ring network. Referring to FIG. 1, downlink channels A, B, C, and D are transmitted in a clockwise sense around the ring of DRU's 125A-k. On the other hand, downlink channels E, F, G and H are transmitted in a counterclockwise sense around the ring of DRUs. Referring to FIG. 2, the uplink channels J, K, L and M are transmitted in a counterclockwise sense whereas uplink channels N, O, P and Q are transmitted in a clockwise sense around the ring of DRUs. If the downlink and uplink data rates were the same, there would be no advantage in the transport mechanism. However, if the data transport is asymmetrical between the downlink and uplink then a significant advantage can be gained. For example, for a factor of two difference between the downlink and uplink data rates, a 4/3 factor increase in data transport can be achieved. The larger the asymmetry between the downlink and uplink data rates, the larger will be the increase in data transport using the unidirectional channel transport mechanism around the ring.

Referring again to FIG. 1, a further embodiment in accordance with another aspect of the present invention may be better understood. In the event that there is a significant change in asymmetry between the downlink and uplink data rates and/or if there is a change in channel complement at the BTS, the Management Control module [discussed in connection with FIG. 7 herein] which is typically comprised within each DAU is able to automatically and adaptively re-allocate data transport resources on the clockwise direction of the ring and on the counterclockwise direction of the ring to maximize the overall transport capacity. As stated previously, the larger the degree of asymmetry between uplink and downlink data rates for a particular DAU, the higher the increase in data transport using the unidirectional channel transport mechanism around the ring. If there is more than one DAU present, in an embodiment one DAU is designated a Master DAU by the NOC, and the Management Control module located in the Master DAU makes decisions to optimize the overall transport capacity. In the event the master DAU fails, the NOC can designate another DAU as master. Alternatively, any suitable failover algorithm can be implemented.

Figure 3:
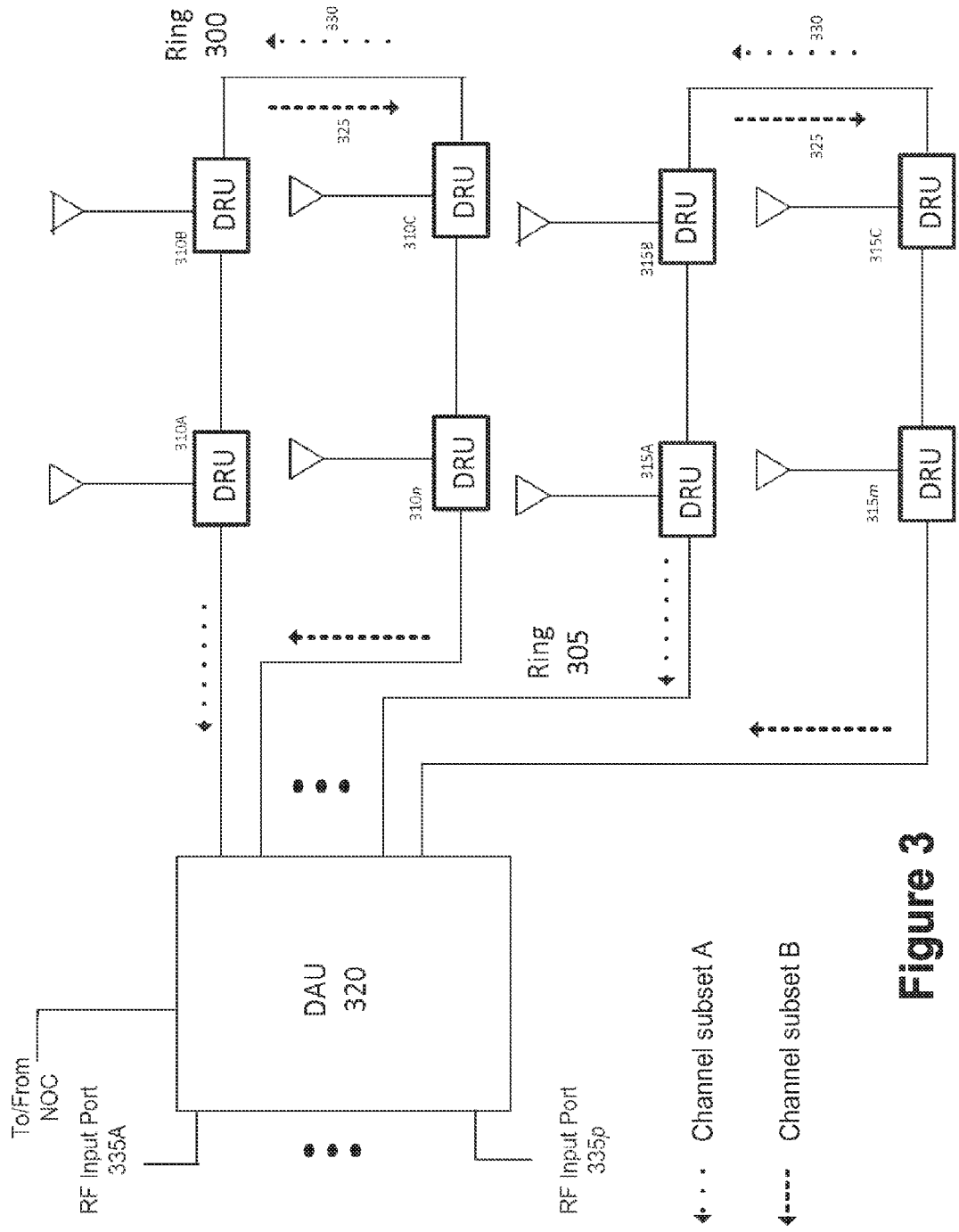
FIG. 3 is a block diagram in accordance with an embodiment of the invention showing the basic structure and an example of a unidirectional, channelized uplink transport, two ring scenario based on having one DAU and eight DRUs.

Referring to FIG. 3, an alternative embodiment of the present invention wherein a single DAU controls a plurality of rings, each comprising a plurality of daisy-chained DRU's, can be better understood. In FIG. 3, two daisy-chained rings, indicated at 300 and 305, are shown although the number of rings could be greater and is determined mainly as a matter of design preference up to limits imposed by network performance. The rings each link a plurality of DRU's 310A-$n$ and 315A-$m$, to a single DAU 320. The directional flow of the data transport is shown as the dashed lines 325 and dotted lines 330. The downlink channels available from the plurality of DRU's are divided into two subsets which flow in opposite directions around the two daisy-chained rings. The uplink channels are transported in a similar fashion. The channels are grouped into the two subsets so as to maximize the data transport to and from the DRUs. The DAU in turn communicates with one or more BTS's via RF Ports 335A p.

Heuristic algorithms may be used to allocate RF channel data in a Dual-ring DAS. For FIG. 3, there are two fibre rings R1, R2 (clockwise and counter clockwise) and a set T of $n \geq 2$ independent RF channels Ki, $1 \leq i \leq n$ (including uplink and downlink). A channel Ki requires a bandwidth of b(Ki) to transport on a fibre ring. A time-bounded algorithm exists which obtains a schedule having the optimal bandwidth allocation (i.e. the maximum aggregate bandwidth of each ring is as small as possible). A large number of advanced heuristic algorithms have been developed to solve such scheduling optimization problems. Some examples are genetic algorithm, evolutionary algorithm, greedy search, Tabu search, harmony search, simulated annealing, ant colony optimization, etc. For purposes of simplicity and clarity, a simple heuristic algorithm for two rings is described here, although the number of rings is not limited to two.

The algorithm begins by sorting the channels Ki decreasingly by bandwidth b(Ki). Then it schedules the channel in such a way that each channel is assigned to the ring which has the smaller aggregate bandwidth. The formal description of the algorithm follows.

Input: T=set of n independent channels Ki with required bandwidth b(Ki), $1 \leq i \leq n$.

Output: $L_1, L_2$ and $D_1, D_2$. Lj is the set of channels schedule on ring Rj, and $D_j$ is the maximum aggregate bandwidth of ring Rj, Dj=Dj=($\Sigma$b(J),J$\in L_j$), $1 \leq j \leq 2$.

ALGORITHM (T, L, D)

Step 1 (initialize Ki and $D_1, D_2$) Sort Ki such that b(Ki)$\leq$b (Ki$_{+1}$), $1 \leq i \leq n-1$. $D_1 \leftarrow 0, D_2 \leftarrow 0$.

Step 2 (Schedule a channel)

For i=1 to n, step 1 do

If $D_1 \leq D_2$, then [assign Ki onto $L_1$, $D_1 \leftarrow D_1 + b(Ki)$].

else [assign Ki onto $L_2$, $D_2 \leftarrow D_2 + b(Ki)$].

Figure 4:
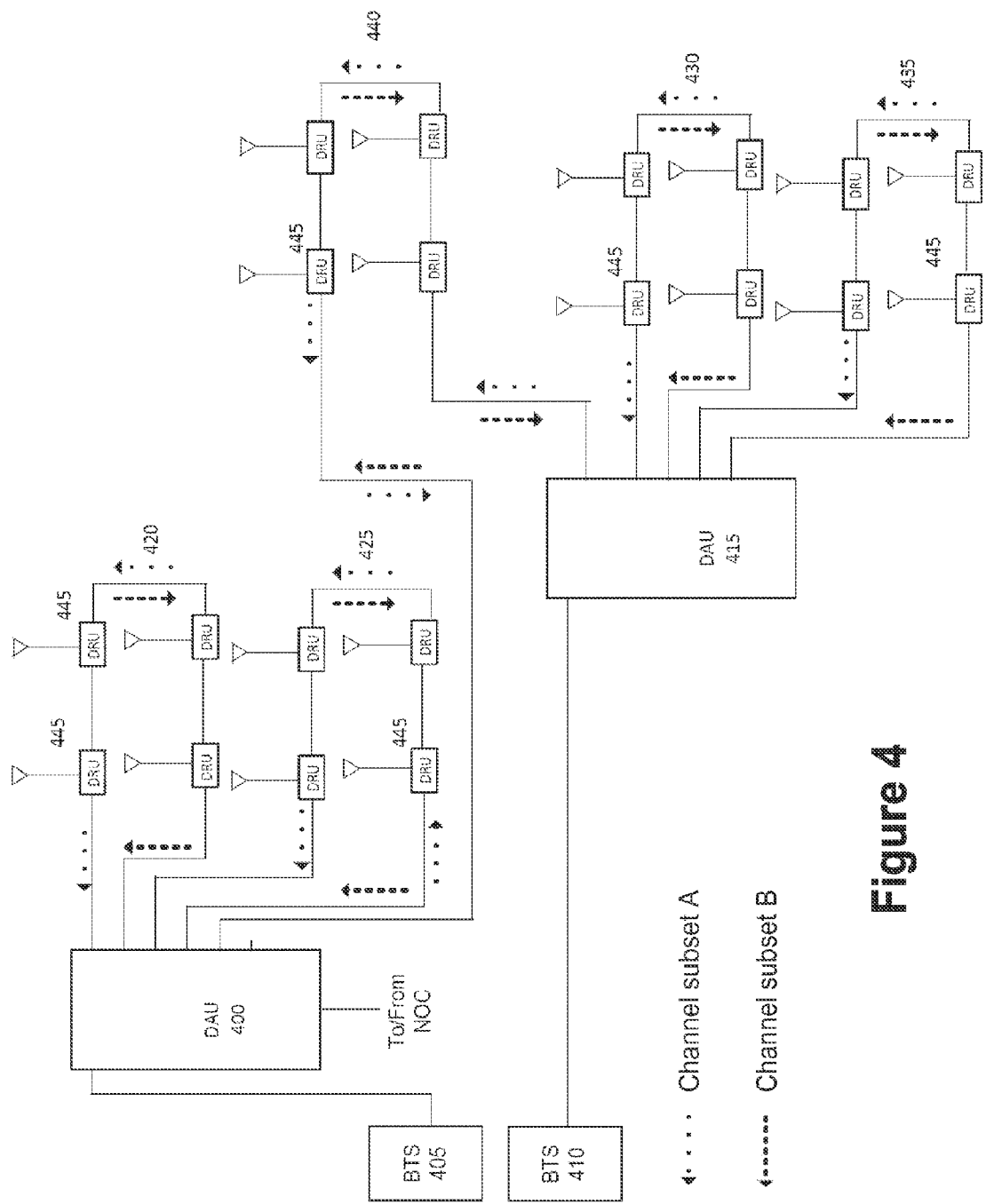
FIG. 4 is a block diagram in accordance with an embodiment of the invention showing the basic structure and an example of a unidirectional channelized uplink or downlink transport. This example of a five ring scenario comprises two DAUs and twenty DRUs.
Figure 8:
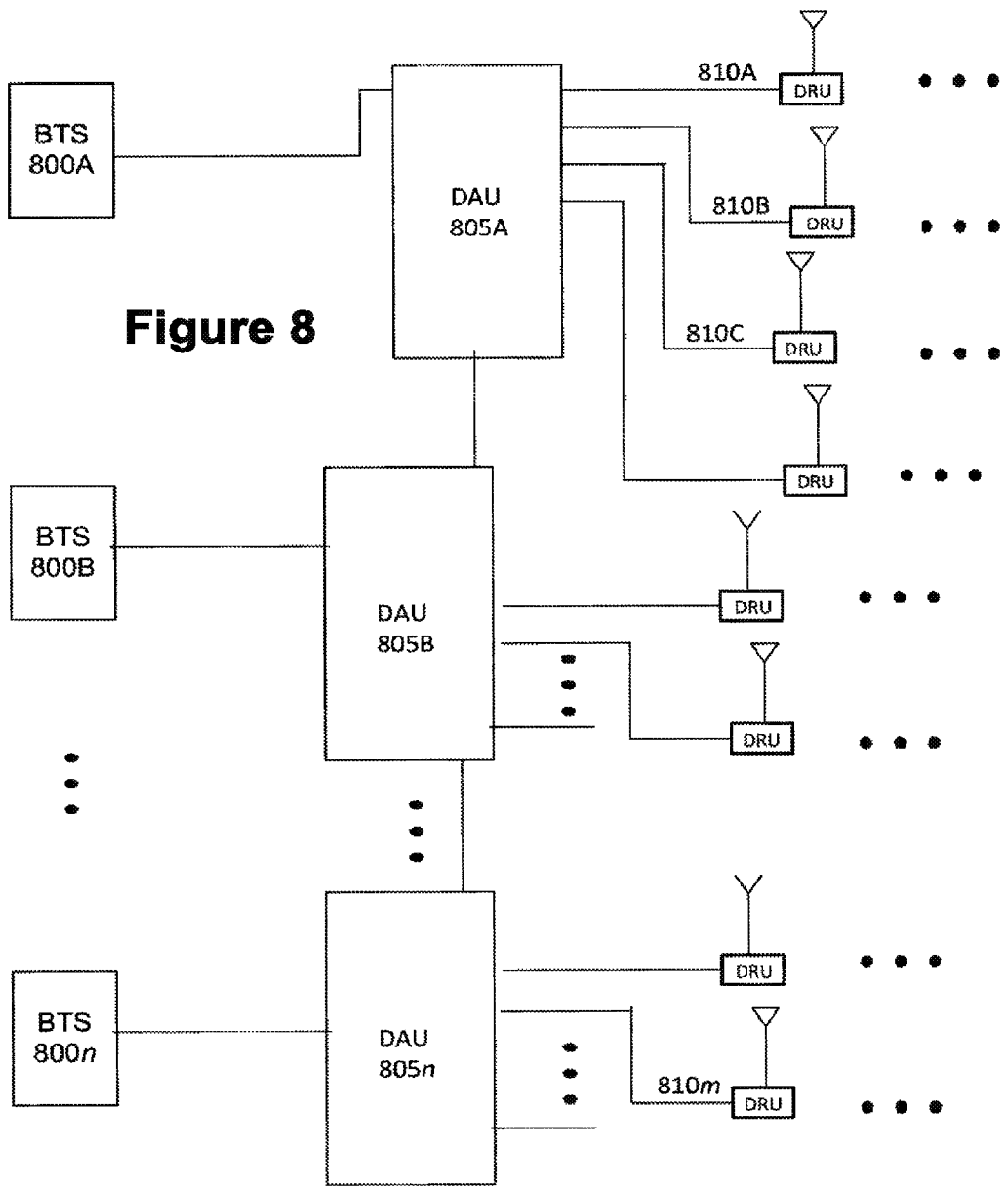
FIG. 8 illustrates in block diagram form an embodiment of a DAS according to an aspect of the invention, including daisy-chained DAU's.

Referring next to FIG. 4, a still further an alternative embodiment of the present invention may be understood. The arrangement illustrated in FIG. 1 comprised downlink signals from two separate base stations belonging to the same wireless operator entering the DAU 105 at input ports 110A and 110p, respectively. In the embodiment of FIG. 4, a first composite signal enters a first DAU 400 at that DAU's RF input port from a base station 405, and a second composite downlink input signal from, e.g., a second base station 410 belonging to a different wireless operator enters DAU 415 at that second DAU's RF input port. DAU 400 directly supports two rings 420 and 425, DAU 415 directly supports two rings 430 and 435, and a ring 440 is shared between DAU 400 and DAU 405. Each of the rings comprises daisy-chained DRU's generally indicated at 445 and connected via, for example, fiber optic links, as discussed in connection with FIG. 1. It will be noted that channels A are transported in the opposite sense as channels B. The downlink channels in subset A are transported counterclockwise around each ring, whereas the channels in subset B are transported in a clockwise sense around each ring. In this embodiment, signals belonging to both the first operator and the second operator are converted and transported to the DRU's 445 on ring 440 because DAU 400 and DAU 405 are daisy-chained through the fiber optic cable 440. This embodiment provides an example of a neutral host wireless system, where multiple wireless operators share a common infrastructure comprised of DAU 400, DAU 415, and DRU's 445. All the previously mentioned features and advantages accrue to each of the two wireless operators. It will further be appreciated that, while FIG. 4 illustrates only two DAU's linked in daisy-chain style, it is possible to daisy chain a larger plurality of DAU's, and the daisy-chained DAU's can also be configured in a ring configuration similar to the manner in which the DRU's are connected. This arranged is illustrated in FIG. 8, below.

As disclosed in U.S. Provisional Application Ser. No. 61/374,593, entitled "Neutral Host Architecture for a Distributed Antenna System," filed Aug. 17, 2010 and again referring to FIG. 1 of the instant patent application, the Digital Up Converters present in the DRU's of the present invention can be programmed to process various signal formats and modulation types including FDMA, CDMA, TDMA, OFDMA and others. Also, the Digital Up Converters present in the respective DRUs can be programmed to operate with signals to be transmitted within various frequency bands subject to the capabilities and limitations of the system architecture disclosed in U.S. Provisional Application Ser. No. 61/374,593, mentioned above. In one embodiment of the present invention where a wideband CDMA signal is present within, e.g., the bandwidth corresponding to a first carrier at the input port to DAU 105, the transmitted signal at the antenna ports of DRU 125A, DRU 125b and DRUk will be a wideband CDMA signal which is virtually identical to the signal present within the bandwidth corresponding to that first carrier at the input port to DAU 105.

As disclosed in U.S. Provisional Application Ser. No. 61/374,593, again identified above, and also referring to FIG. 1 of the instant patent application, it is to be understood that the Digital Up Converters present in the respective DRUs can be programmed to transmit any desired composite signal format to each of the respective DRU antenna ports. As an example, the Digital Up Converters present in DRU 125A and DRU 125B can be dynamically software-reconfigured as described previously so that the signal present at the antenna port of DRU 125A would correspond to the spectral profile shown in FIG. 1 as 155A and also that the signal present at the antenna port of DRU 125B would correspond to the spectral profile shown in FIG. 1 as 155B. The application for such a dynamic re-arrangement of DRU capacity would be e.g., if a company meeting were suddenly convened in the area of the enterprise corresponding to the coverage area of DRU 125B.

Referring again to FIG. 2, another embodiment of the Distributed Antenna System of the present invention can be better understood. As disclosed in the aforementioned U.S. Provisional Application Ser. No. 61/374,593, and also as shown in FIG. 2, the optical ring transport mechanism can be implemented with regard to uplink signals. As discussed previously with regard to downlink signals and by referring to FIG. 1, the uplink system shown in FIG. 2 is mainly comprised of DAU 105, together with DRU's 125A-125k. In a manner similar to the downlink operation explained by referring to FIG. 1, the operation of the uplink system shown in FIG. 2 can be understood as follows.

The Digital Down Converters present in each of DRU's 125A-k are dynamically software-configured as described previously so that uplink signals of the appropriate desired signal format(s) present at the receive antenna ports of the respective DRU's 125A-125k are selected based on the desired uplink band(s) to be processed and filtered, converted and transported to the appropriate uplink output port of DAU 105. The DAU and DRUs frame the individual data packets corresponding to their respective radio signature using the Common Public Interface Standard (CPRI). Other Interface standards are applicable provided they uniquely identify data packets with respective DRUs. Header information is transmitted along with the data packet which indentifies the DRU and DAU that corresponds to the individual data packet.

In one example for the embodiment shown in FIG. 2, DRU's 125A and 125C are configured to receive uplink signals within the Channel K bandwidth, whereas DRU 125b and DRU 125n are both configured to reject uplink signals within the Channel K bandwidth. When DRU 125C receives a strong enough signal at its receive antenna port within the Channel K bandwidth to be properly filtered and processed, the Digital Down Converters within DRU 125C facilitate processing and conversion. Similarly, when DRU 125A receives a strong enough signal at its receive antenna port within the Channel K bandwidth to be properly filtered and processed, the Digital Down Converters within DRU 125A facilitate processing and conversion. The signals from DRU 125A and DRU 125C are combined based on the active signal combining algorithm, and are fed to the base station connected to the uplink output port of DAU 105. The term simulcast is frequently used to describe the operation of DRU 125A and DRU 125C with regard to uplink and downlink signals within Channel K bandwidth. The term Flexible Simulcast refers to the fact that the present invention supports dynamic and/or manual rearrangement of which specific DRU are involved in the signal combining process for each Channel bandwidth.

Referring still to FIG. 2, the Digital Down Converters present in DRU 125A are configured to receive and process signals within Channel J-Q bandwidths. The Digital Down Converters present in DRU 125b are configured to receive and process signals within Channel J, L, M and O bandwidths. The Digital Down Converters present in DRU 125C are configured to receive and process signals within Channel K and O bandwidths. The Digital Down Converters present in DRU 125n are configured to receive and process signals within Channel J, M, N and Q bandwidths. The respective high-speed digital signals resulting from processing performed within each of the four DRU are routed to the DAU. As described previously, the uplink signals from the four DRUs are combined within the respective DAU corresponding to each base station.

In summary, the Reconfigurable Distributed Antenna System of the present invention described herein efficiently conserves resources and reduces costs. The reconfigurable system is adaptive or manually field-programmable, since the algorithms can be adjusted like software in the digital processor at any time.

Figure 5:
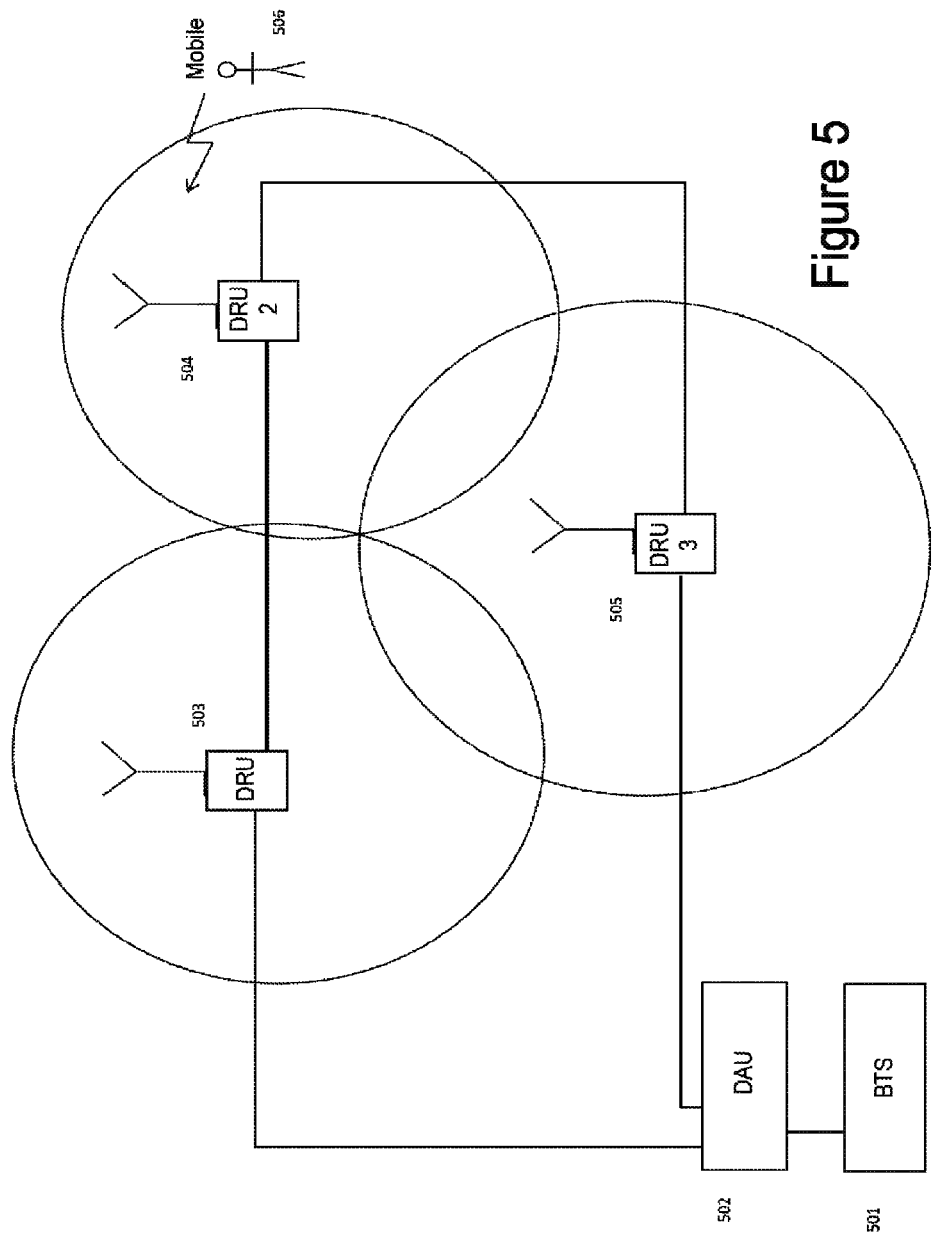
FIG. 5 illustrates an embodiment of a cellular network system employing multiple DRUs according to the present invention.

Referring next to FIG. 5, an alternative embodiment of the present invention may be better understood. FIG. 5 provides a daisy chain example of a distributed antenna system (DAS). Each DRU has a coverage radius that can be adjusted based on the power transmission from that particular remote unit. The DAU controls the various DRU's transmission power and can optimize the overall coverage zone. In the illustrated embodiment, DAU 502, again under the control of a NOC (not shown), is associated with a base station 501 and in turn interfaces with three DRU's 503, 504 and 505. A user 506 with a mobile device is provided relatively uniform coverage throughout the area covered by the three DRU's.

Figure 6:
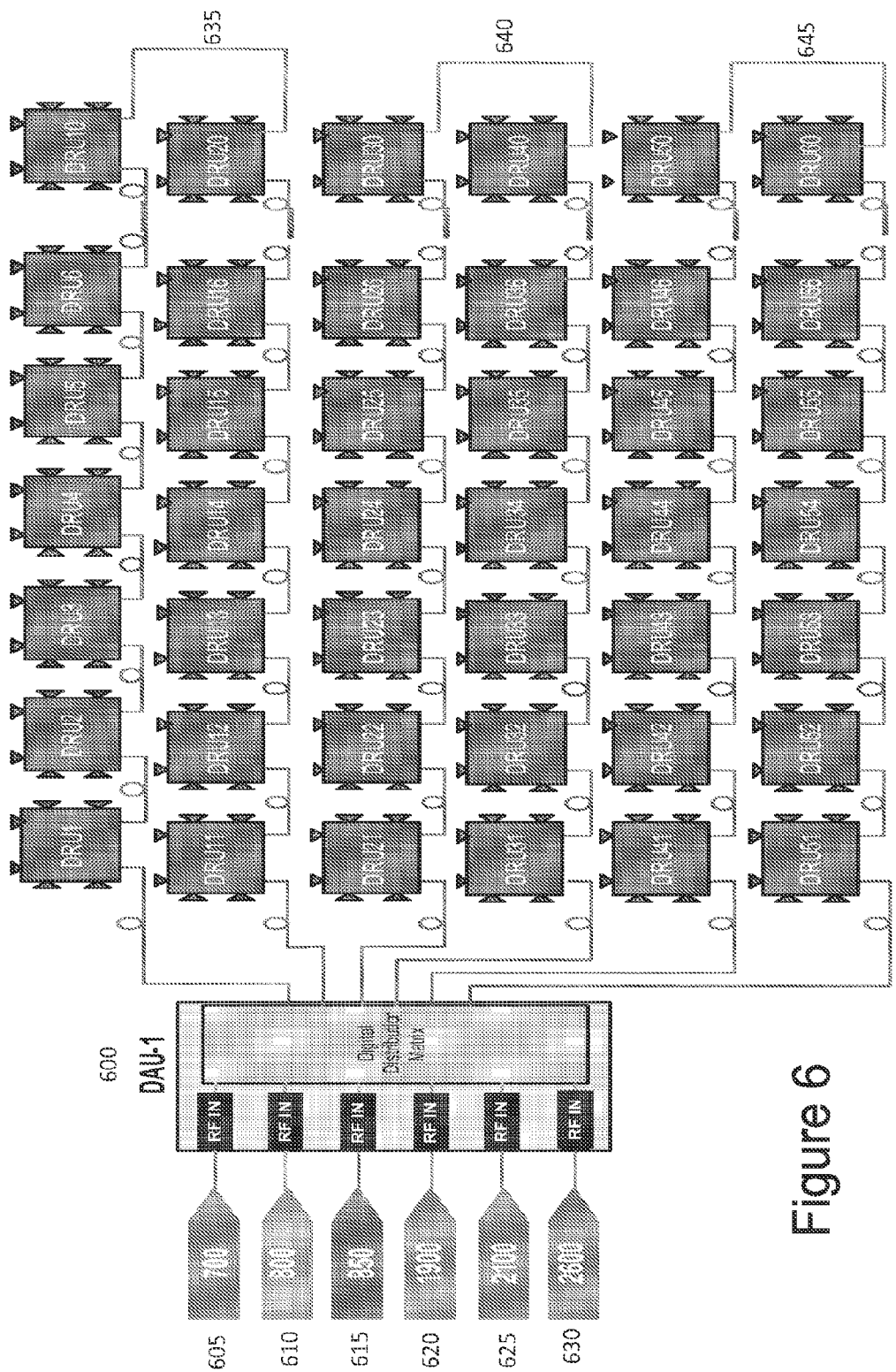
FIG. 6 illustrates an embodiment of a multi-band system employing six different services operating in different frequency channels with multiple DRUs according to the present invention.

Referring next to FIG. 6, a still further alternative embodiment may be better appreciated. FIG. 6 shows an embodiment of a multi-band system illustrating one DAU supporting up to six different services operating at different frequency bands, with three optical rings of DRU's 1-60. The input frequency bands 605-630 (here denoted as six frequency bands at 700, 800, 850, 1900, 2100 and 2600 MHz) are input into the DAU 600 from the BTS's (not shown). The DAU includes, among other functionalities discussed herein, an RF IN portion for each band, and a digital distribution matrix for distributing the frequency bands to a plurality of DRU's, indicated as DRU1-DRU60, daisy-chained along three separate rings 635, 640 and 645 for achieving the desired coverage. The frequency bands are transported to either all or a subset of DRUs. The particular number of frequency bands, DAU's, DRU's and rings is exemplary only, and can, in practice, be any number appropriate to the performance capabilities and needs of the network.

Figure 7:
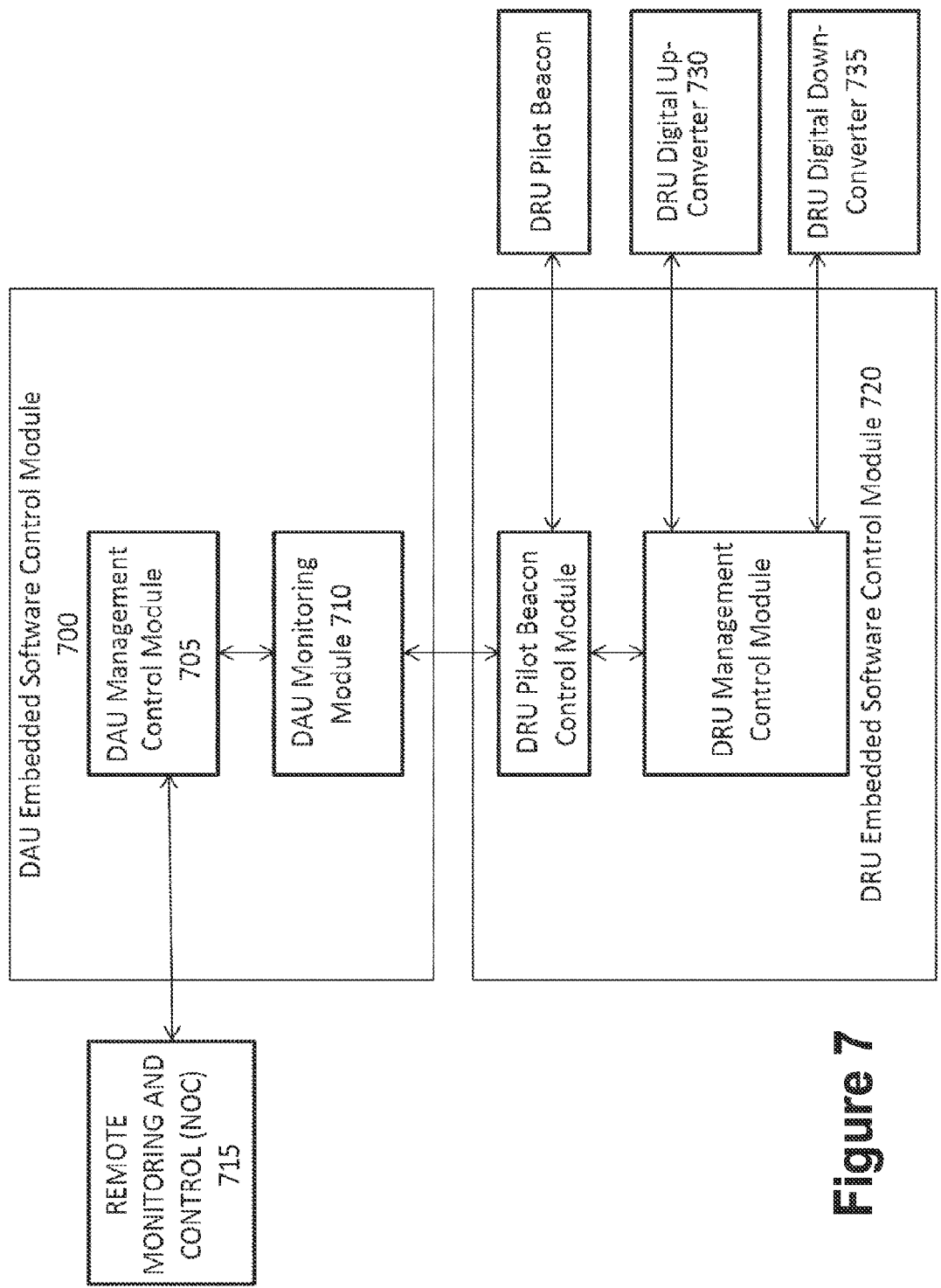
FIG. 7 illustrates in block diagram form the interaction between the DAU embedded software control module and the DRU embedded software control module.

Referring next to FIG. 7 that illustrates embedded software control modules, the software embedded in the DAU and DRU, which controls the operation of key functions of these devices, can be better understood. In particular, the DAU embedded software control module 700 comprises a DAU Management Control Module 705 and a DAU monitoring module 710. The DAU Management Control Module 705 communicates with the NOC 715, and also the DAU monitoring module 710. One such key function is determining and/or setting the appropriate amount of radio resources (such as RF carriers, CDMA codes or TDMA time slots) assigned to a particular DRU or group of DRUs to meet desired capacity and throughput objectives. As noted previously, the NOC 715 monitors the DAS operation and sends commands to the DAU's for configuring various functions of the DRU's as well as the DAU, in at least some embodiments.

The DAU Monitoring module, in addition to other functions, detects which carriers and corresponding time slots are active for each DRU. The DAU Management Control module communicates with the DRU Embedded Software Control module 720 over a fiber optic link control channel via a control protocol. In an embodiment, the control protocol comprises headers together with packets of data, such that both control information and data are transmitted to the DRU's together as a message. DRU functions or features that the header would control in the DRU are typically implementation specific and can include, among other things, measuring uplink and downlink power, measuring gain of uplink and downlink, and monitoring alarms in the DRU.

In turn, the DRU Management Control module 725 within the DRU Embedded Software Control Module sets the individual parameters of all the DRU Digital Up-Converters 730 to enable or disable specific radio resources from being transmitted by a particular DRU or group of DRUs, and also sets the individual parameters of all the DRU Digital Down-Converters 735 to enable or disable specific radio resources from being transmitted by a particular DRU or group of DRUs. In addition, the DRU Embedded Software Control Module comprises a DRU Pilot Beacon Control Module 740, which communicates with a DRU Pilot Beacon 745.

Referring next to FIG. 8, an embodiment of a daisy-chained configuration of DAU's is illustrated, together with a daisy-chained configuration of DRU's. In an embodiment, a plurality of base stations 800A-800n are each associated with one of DAU's 805A-n. The DAU's are daisy-chained, and each DAU communicates with one or more daisy-chains 810A-810m of DRU's which may or may not be arranged in a ring configuration. It will be appreciated that the DAU's can also be configured in a ring configuration, as discussed above.

An algorithm operating within the DAU Monitoring module which detects which carriers and corresponding time slots for each carrier are active for each DRU provides information to the DAU Management Control module to help identify when, e.g., a particular downlink carrier is loaded by a percentage greater than a predetermined threshold whose value is communicated to the DAU Management Control module by the DAU's Remote Monitoring and Control function 715. If that occurs, the DAU Management Control module can adaptively modify the system configuration to begin to deploy, typically although not necessarily slowly, additional radio resources (such as RF carriers, CDMA codes or TDMA time slots) for use by a particular DRU which need those radio resources within its coverage area. At the same time, usually the DAU Management Control module adaptively modifies the system configuration to begin to remove, again typically slowly, certain radio resources (such as RF carriers, CDMA codes or TDMA time slots) for use by a particular DRU where that DRU no longer needs those radio resources within its coverage area.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

APPENDIX I

Glossary of Terms

ACLR Adjacent Channel Leakage Ratio
ACPR Adjacent Channel Power Ratio
ADC Analog to Digital Converter
AQDM Analog Quadrature Demodulator
AQM Analog Quadrature Modulator
AQDMC Analog Quadrature Demodulator Corrector
AQMC Analog Quadrature Modulator Corrector
BPF Bandpass Filter
BTS Base Transceiver System or Base Station
CDMA Code Division Multiple Access
CFR Crest Factor Reduction
DAC Digital to Analog Converter
DAU Digital Access Unit
DET Detector
DHMPA Digital Hybrid Mode Power Amplifier DDC Digital Down Converter
DNC Down Converter
DPA Doherty Power Amplifier
DQDM Digital Quadrature Demodulator
DQM Digital Quadrature Modulator
DSP Digital Signal Processing
DUC Digital Up Converter
EER Envelope Elimination and Restoration
EF Envelope Following
ET Envelope Tracking
EVM Error Vector Magnitude
FFLPA Feedforward Linear Power Amplifier
FIR Finite Impulse Response
FPGA Field-Programmable Gate Array
GSM Global System for Mobile communications
I-Q In-phase/Quadrature
IF Intermediate Frequency
LINC Linear Amplification using Nonlinear Components
LO Local Oscillator
LPF Low Pass Filter
MCPA Multi-Carrier Power Amplifier
MDS Multi-Directional Search
OFDM Orthogonal Frequency Division Multiplexing
PA Power Amplifier
PAPR Peak-to-Average Power Ratio
PD Digital Baseband Predistortion
PLL Phase Locked Loop
PN Pseudo-Noise
QAM Quadrature Amplitude Modulation
QPSK Quadrature Phase Shift Keying
RF Radio Frequency
RRH Remote Radio Head
RRU Remote Radio Head Unit
SAW Surface Acoustic Wave Filter
UMTS Universal Mobile Telecommunications System
UPC Up Converter
WCDMA Wideband Code Division Multiple Access
WLAN Wireless Local Area Network

What is claimed is:

1. A method of communicating in a distributed antenna system (DAS), the method comprising:
providing a plurality of digital remote units;
providing at least one digital access unit configured to communicate with the plurality of digital remote units, wherein the plurality of digital remote units and the at least one digital access unit are daisy-chained such that each digital remote unit is coupled to a next digital remote unit or to the at least one digital access unit, the at least one digital access unit configured to receive a plurality of downlink channels from at least one signal source and to send the plurality of downlink channels to the plurality of digital remote units;
sending a first portion of the plurality of downlink channels from the at least one digital access unit to a first digital remote unit of the plurality of digital remote units; and
sending a second portion of the plurality of downlink channels from the at least one digital access unit to a second digital remote unit of the plurality of digital remote units, wherein a number of channels in the first portion of the plurality of downlink channels is different from a number of channels in the second portion of the plurality of downlink channels, and at least some channels in the first portion of the plurality of downlink channels are same as some channels in the second portion of the plurality of downlink channels and at least some channels in the first portion of the plurality of downlink channels are different from some channels in the second portion of the plurality of downlink channels.

2. The method of claim 1 wherein the first digital remote unit is configured to transmit the first portion of the plurality of downlink channels received from the at least one digital access unit and to receive a corresponding first portion of uplink channels.

3. The method of claim 1 wherein the second digital remote unit is configured to transmit the second portion of the plurality of downlink channels received from the at least one digital access unit and to receive a corresponding second portion of uplink channels.

4. The method of claim 1 wherein the plurality of digital remote units and the at least one digital access unit are daisy-chained in a ring and each digital remote unit is accessible by the at least one digital access unit in either direction around the ring.

5. The method of claim 1 wherein the at least one digital access unit comprises a plurality of digital access units each coupled to at least one of the plurality of digital access units.

6. The method of claim 1 wherein a number of the first portion of the plurality of downlink channels is less than a number of the second portion of the plurality of downlink channels.

7. The method of claim 1 wherein the plurality of downlink channels comprise a plurality of carriers.

8. The method of claim 1 wherein the plurality of downlink channels comprise a plurality of frequency bands.

9. A method of communicating in a distributed antenna system (DAS), the method comprising:
providing a plurality of digital remote units;
providing a plurality of digital access units, at least one of the plurality of digital access units configured to communicate with the plurality of digital remote units, wherein the plurality of digital remote units and the plurality of digital access units are daisy-chained such that each digital remote unit is coupled to a next digital remote unit or to a digital access unit, the at least one of the plurality of digital access units configured to receive a plurality of downlink channels from at least one signal source and to send the plurality of downlink channels to the plurality of digital remote units;
sending a first portion of the plurality of downlink channels from the at least one of the plurality of digital access units to a first digital remote unit of the plurality of digital remote units; and
sending a second portion of the plurality of downlink channels from the at least one of the plurality of digital access units to a second digital remote unit of the plurality of digital remote units, wherein a number of channels in the first portion of the plurality of downlink channels is different from a number of channels in the second portion of the plurality of downlink channels, and at least some channels in the first portion of the plurality of downlink channels are same as some channels in the second portion of the plurality of downlink channels, and at least some channels in the first portion of the plurality of downlink channels are different from some channels in the second portion of the plurality of downlink channels.

10. The method of claim 9 wherein the first digital remote unit is configured to transmit the first portion of the plurality of downlink channels received from the at least one of the plurality of digital access units and to receive a corresponding first portion of uplink channels.

11. The method of claim 9 wherein the second digital remote unit is configured to transmit the second portion of the plurality of downlink channels received from the at least one of the plurality of digital access units and to receive a corresponding second portion of uplink channels.

12. The method of claim 9 wherein the plurality of digital remote units and the at least one of the plurality of digital access units are daisy-chained in a ring and each digital remote unit is accessible by the at least one of the plurality of digital access units in either direction around the ring.

13. The method of claim 9 wherein each of the plurality of digital access units are coupled to at least another one of the plurality of digital access units.

14. The method of claim 9 wherein a number of the first portion of the plurality of downlink channels is less than a number of the second portion of the plurality of downlink channels.

15. The method of claim 9 wherein the plurality of downlink channels comprise a plurality of carriers.

16. The method of claim 9 wherein the plurality of downlink channels comprise a plurality of frequency bands.

\* \* \* \* \*